(12) United States Patent
Kalin et al.

(10) Patent No.: US 11,714,135 B2
(45) Date of Patent: Aug. 1, 2023

(54) METHOD FOR DETERMINING THE CAPACITY OF LI-ION CELLS WITH THE AID OF DISTINCT POINTS

(71) Applicant: AUDI AG, Ingolstadt (DE)

(72) Inventors: Dorothea Kalin, Munich (DE); Christian Röttinger, Ingolstadt (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 17/409,603

(22) Filed: Aug. 23, 2021

(65) Prior Publication Data

US 2022/0065938 A1 Mar. 3, 2022

(30) Foreign Application Priority Data

Aug. 25, 2020 (DE) .......................... 102020122111.8

(51) Int. Cl.
*G01R 31/388* (2019.01)
*H02J 7/00* (2006.01)

(52) U.S. Cl.
CPC .......... *G01R 31/388* (2019.01); *H02J 7/0048* (2020.01)

(58) Field of Classification Search
None
See application file for complete search history.

(56) References Cited

U.S. PATENT DOCUMENTS

| | | | |
|---|---|---|---|
| 2001/0022518 A1* | 9/2001 | Asakura | H02M 3/07 324/426 |
| 2013/0043876 A1 | 2/2013 | Liu et al. | |
| 2013/0314050 A1 | 11/2013 | Matsubara et al. | |
| 2016/0049821 A1* | 2/2016 | Aridome | H02J 7/0047 320/128 |
| 2019/0334213 A1* | 10/2019 | Kodama | H01M 10/345 |

FOREIGN PATENT DOCUMENTS

| | | |
|---|---|---|
| DE | 10 2010 050 980 A1 | 6/2011 |
| DE | 10 2016 215 991 A1 | 3/2018 |
| DE | 11 2016 003 166 T5 | 3/2018 |
| WO | 2009/009758 A2 | 1/2009 |

* cited by examiner

*Primary Examiner* — Jas A Sanghera

(74) *Attorney, Agent, or Firm* — Seed IP Law Group LLP

(57) ABSTRACT

A method for determining the capacity of at least one lithium-ion cell, in particular of at least one high-voltage battery, during open circuit voltage aging, uses at least one distinct point in a voltage curve and/or in at least one open circuit voltage of the Li-ion cell.

12 Claims, 1 Drawing Sheet

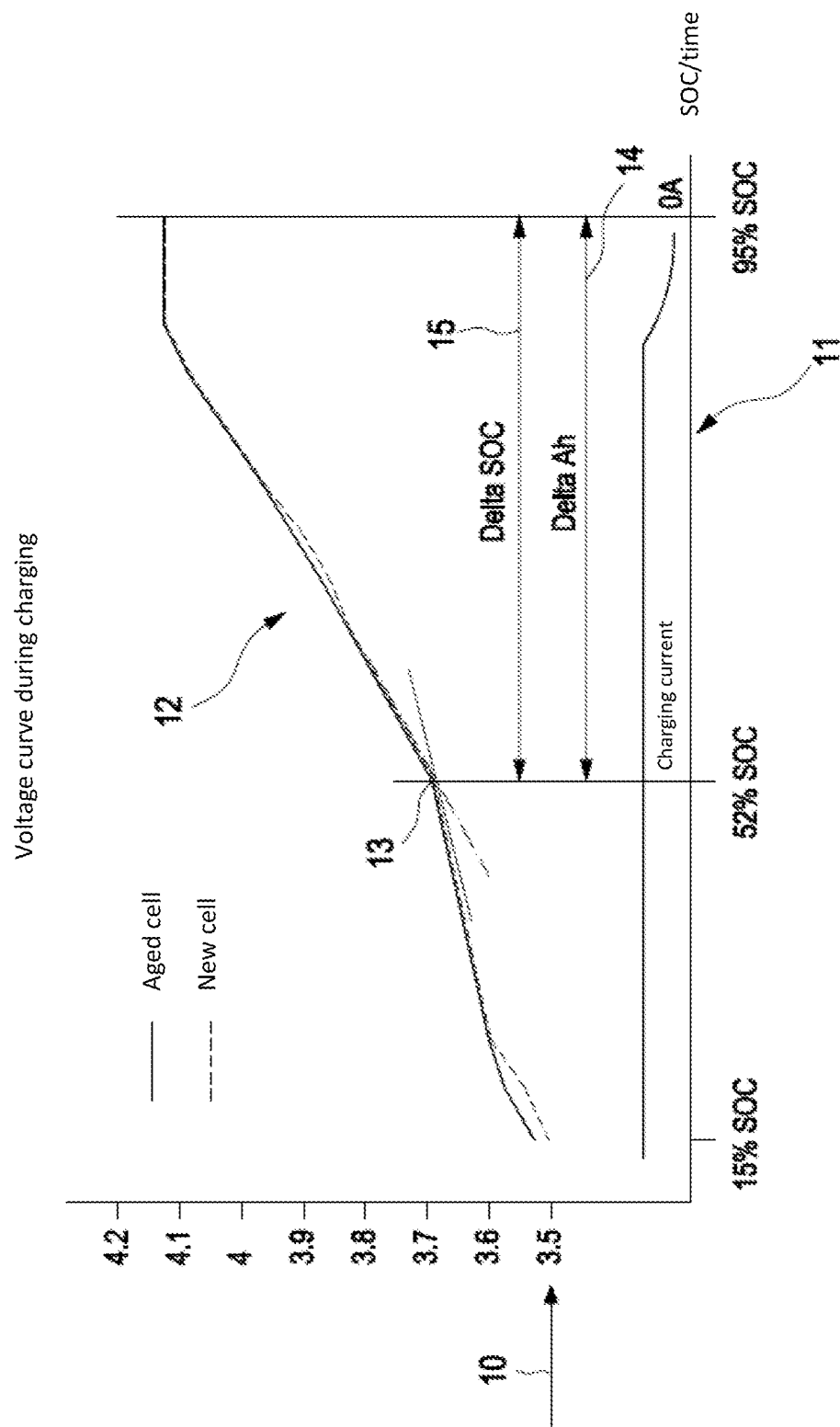

METHOD FOR DETERMINING THE CAPACITY OF LI-ION CELLS WITH THE AID OF DISTINCT POINTS

BACKGROUND

Technical Field

Embodiments of the present invention relate to a method for determining the capacity of at least one lithium-ion (Li-ion) cell, in particular of at least one high-voltage (HV) battery, during open circuit voltage (OCV) aging with the aid of at least one distinct point in at least one voltage curve and/or in at least one open circuit voltage (OCV) of the Li-ion cell. An open circuit voltage is a no-load voltage.

Description of the Related Art

Methods for determining a capacity of Li-ion cells are known.

For example, a method for estimating a state of charge for a lithium-ion battery is known from document DE 11 2016 003 166 T5, in which a lithium-phosphate compound having an olivine-type crystal structure is used for a positive electrode, and an active material that, due to an insertion/desorption reaction of lithium, does not exhibit any potential fluctuation is used for a negative electrode, which is based on a voltage change rate.

Electroactive compositions for use in lithium-ion battery electrodes are known from the document WO 2009 009 758 A2. The compositions, such as multifunctional mixed metal olivines, provide an electrochemical cell having multiple open circuit voltages at different states of charge. The compositions afford improved state of charge monitoring, overcharge protection and/or over-discharge protection for lithium-ion batteries.

A method for estimating the state of charge of a lithium-ion battery is known from document US 2013 043 876 A1. The method comprises charging a lithium-ion battery, as well as recording multiple groups of ampere-hour integral values and states of charge and voltage values corresponding to the ampere-hour integral values.

At present, a capacity of a Li-ion cell or of an HV battery is determined as follows in a battery management system of a vehicle. After an idle phase of typically 30 minutes to one hour, an exact state of charge (SOC) value of the Li-ion cell or of the HV battery is determined by measuring an open circuit voltage of the Li-ion cell or of the HV battery.

During a subsequent charge or discharge, a charge throughput is integrated in ampere hours (Ah). During a subsequent idle phase of again typically 30 minutes to one hour, the exact SOC value of the Li-ion cell or of the HV battery is determined again by way of an open circuit voltage thereof. Using the rule of three via $\Delta Ah$ for $\Delta SOC$, a capacity of Li-ion cell or of the HV battery is back-calculated.

The previously used algorithms assume that an open circuit voltage can be directly converted to an SOC value in the case of Li-ion batteries. This works in particular in the case of cell chemistries with a lithium nickel manganese cobalt oxide (NMC) variant up to NMC333.

When using new cell chemistries with further lithium nickel manganese cobalt oxide variants, such as NMC622 and NMC822, aging affects occur in the OCV to a greater extent, which cause the OCV to change in a non-deterministic manner, at least in some areas, with aging and cyclization.

As a result, an SOC can no longer be reliably assigned to a measured OCV value since the error that occurs becomes too great to be able to continue the calculation in a meaningful manner.

If the effect occurs in a plug-in hybrid (PHEV) vehicle or in an electric vehicle (battery electric vehicle, BEV), for example in an SOC range in which the vehicle is normally parked, such as for example in the case of a residual range of zero kilometers, in the case of a PHEV at a SOC value of 15% to 25%, and in the case of a BEV at a SOC value of 5% to 10%, a clear capacity determination is no longer possible since a lower base point of the calculation can no longer be clearly determined. At the same time, this range cannot simply be masked since capacity determinations are then essentially no longer possible.

BRIEF SUMMARY

Embodiments described herein provide a method that renders a capacity determination of a Li-ion cell or of an HV battery more exact and more robust.

Embodiments of the present invention relate to a method for determining the capacity of at least one lithium-ion (Li-ion) cell, in particular of at least one high-voltage (HV) battery, during open circuit voltage (OCV) aging with the aid of at least one distinct point in at least one voltage curve or in at least one open circuit voltage (OCV) of the Li-ion cell.

In a first step, the at least one OCV of the Li-ion cell or of the at least one voltage curve of the Li-ion cell is measured during a charging process of the Li-ion cell. For example, the voltage curve is measured during a constant charging process.

In a further step, the at least one distinct point of the at least one OCV of the Li-ion cell or of the at least one voltage curve of the Li-ion cell is detected. A distinct point is a point in the OCV or in the voltage curve during a charging process at which an orientation of the OCV or of the voltage curve abruptly changes drastically. A rapid change is present when the second derivative of the voltage changes with respect to time.

In a further step, a shift of at least one of the at least one distinct point in at least one of the at least one OCV of the Li-ion cell or in at least one of the at least one voltage curve of the Li-ion cell due to the OCV aging is checked. In general, it is checked in the process that the at least one distinct point does not shift due to OCV aging relative to an SOC value. A shift in the absolute voltage is not critical as long as the curve remains discernible.

In a further step, the at least one distinct point in the OCV of the Li-ion cell or in the voltage curve of the Li-ion cell is exactly ascertained when a non-shift of the distinct point has been checked.

In a further step, the at least one distinct point is used as a state of charge (SOC) reference point. In this way, an alternative reference point that can be reliably determined is used instead of an exact SOC which is determined via the OCV. This offers the advantage that the capacity determination becomes more exact and more robust again.

In particular, the method is configured to use at least one characteristic distinct point in the OCV of the Li-ion cell or in the voltage curve of the Li-ion cell, in particular during a charging process. The method is configured to ensure by way of at least one measurement, prior to a use of a distinct point, that this at least one distinct point does not shift over OCV aging.

In an alternative embodiment, the capacity of the at least one Li-ion cell, in particular of the at least one high-voltage (HV) battery, is ascertained during the open circuit voltage (OCV) aging with the aid of the at least one distinct point while charging the Li-ion cell with a constant voltage (constant voltage (CV) charging). A CV charging process is thus a charging process using a constant voltage.

In one refinement of the method, the at least one distinct point is generated during a charging process of the at least one Li-ion cell, toward an end of a charging process with a constant current and a constant voltage (CC-CV), to a cell voltage which can be reliably assigned to an SOC, without a customary waiting period. This offers the advantage that polarization effects in the OCV can be circumvented, and additionally the method is expedited. The customary waiting period is generally between 30 minutes and one hour.

The at least one distinct point can thus be actively generated in a voltage curve when, at least toward the end of the charging process, charging to a cell voltage occurs with a constant current and a constant voltage (CC-CV). As an alternative, the at least one distinct point can be generated in a constant voltage (CV) charging process when charging to a cell voltage is carried out with a constant current and a constant voltage (CC-CV).

This offers the advantage that a capacity determination is even possible when a 1:1 correlation between OCV aging and an SOC value is no longer given at operating points that are relevant for the calculation.

In another refinement, the at least one distinct point is ascertained in an open circuit voltage characteristic curve. The at least one distinct point generally has a kink-like configuration. As an alternative, the at least one distinct point is a kink-like curve. The open circuit voltage characteristic curve is generally ascertained in a state of charge mid-range.

In the process, at least one distinct, in particular kink-like point or at least one distinct voltage curve, a distinct OCV or at least one other distinct progression in the open circuit voltage characteristic curve is present for a particular Li-ion cell. In particular, the method is configured to ensure, during the cell qualification, by way of at least one measurement that this at least one point or the at least one distinct voltage curve, the at least one distinct OCV or the at least one other distinct progression does not shift relative to an SOC value due to OCV aging.

In particular, the method is thus configured to use at least one distinct point in the OCV of the Li-ion cell or in the voltage curve of the Li-ion cell, in particular during a charging process, when previously it was ensured by way of measurements that this at least one distinct point does not shift due to OCV aging.

In one embodiment, the at least one distinct point is formed at a state of charge (SOC) between 10% and 90%, and in particular between 30% and 70%. A distinct point is typically a stable point. A distinct point is a kink-like point. A stable point is a distinct point that remains constant over aging. In one embodiment, the distinct point is at a state of charge between 40% and 60%, and in particular between 45% and 55%. For example, in one embodiment the distinct point is at a state of charge of 52%.

In one refinement, the at least one distinct point is ascertained during an alternating current (AC) charging process. In general, the at least one distinct point in the voltage curve or in the OCV becomes clearly apparent under load since the charging current is comparatively low, but constant. In this way, an easy evaluation is possible.

As an alternative, the at least one distinct point is ascertained during a direct current (DC) charging process. In this way, the method is additionally configured to ascertain the at least one distinct point during DC charging with high currents.

In one embodiment of the method, the at least one distinct point is ascertained by way of a gradient of the voltage. Such an ascertainment is referred to as kink detection. In the simplest case, the kink detection occurs via at least one gradient of the voltage.

In particular, the method is thus configured to use at least one characteristic kink point in at least one voltage curve or in at least one OCV of the Li-ion cell, in particular during a charging process, when previously it was ensured by way of measurements that this at least one kink point does not shift due to OCV aging.

In another embodiment of the method, the at least one distinct point is achieved in the case of a rapid change of the gradient. In the simplest case, the kink detection thus occurs via the gradients of the voltage. A particular kink point is reached when a corresponding gradient of the voltage changes accordingly rapidly. A rapid change is present, for example, when $d^2U/dt^2=0$. This point then reliably corresponds to a defined SOC value, for example 52%.

In general, a kink point is ascertained taking at least one threshold value into consideration. At at least one of the at least one threshold values, $d^2U/dt^2$, the second derivative of the voltage with respect to time, is not zero and greater than a threshold value to be defined in a project-specific manner. The threshold value is settable or selectable.

In one refinement, a charging current can be integrated, or is integrated, up to a subsequent distinct point (SOC point) that can be exactly determined, proceeding from the rapid change of the gradient. The method is thus configured to integrate the charging current up to a subsequent exactly determinable SOC point after the at least one kink point or distinct point has been detected.

For example, a subsequent determinable SOC value can be formed by a waiting period of 30 minutes to one hour or by an open circuit voltage adjustment at an end of a charging process.

In an alternative embodiment of the method, a Li-ion cell or an HV battery which already exhibits polarization effects, or for reducing a waiting period, continues to be charged with a constant current via a constant voltage (CC-CV). This means that charging occurs with a constant voltage, and thus with a decreasing current, to the OCV which corresponds to the target state of charge of 95%, for example. The charging process is only terminated when a charging current has dropped below a certain threshold, such as 100 mA. In this way, the desired state of charge can be reliably set.

In addition, a distinct point can be generated without the otherwise customary waiting period by way of a charging process, with a constant voltage, to a cell voltage that can be reliably assigned to an SOC, for example so as to circumvent polarization effects that occur in the OCV or so as to expedite the method.

Using the rule of three, an overall capacity of the Li-ion cell or of the HV battery can thus be extrapolated via $\Delta Ah$ and $\Delta SOC$ between at least two reliably and exactly determined distinct points.

BRIEF DESCRIPTION OF THE SEVERAL VIEWS OF THE DRAWINGS

The FIGURE shows a diagram of a voltage curve when charging a new cell and an aged cell.

DETAILED DESCRIPTION

The diagram shows open circuit voltage (OCV) aging 10 of a particular lithium-ion (Li-ion) cell or of a high voltage (HV) battery on a vertical axis. OCV aging is shown between 3.5 volts and 4.2 volts.

A state of charge 11 (SOC) of a particular lithium-ion (Li-ion) cell or of a high voltage (HV) battery is shown on a horizontal axis of the diagram. The SOC is shown between 15% SOC and 95% SOC.

Shown is a respective voltage curve 12 of a new cell, which is shown by a solid line, and of an aged cell, which is shown by a dotted line, during a charging process or during charging of the particular lithium-ion (Li-ion) cell or the particular high-voltage (HV) battery.

The diagram shows that both the voltage curve 12 of the new cell and the voltage curve of the aged cell in each case form a distinct point 13 or a kink point at a state of charge (SOC) of 52%. The distinct point 13 can be ascertained by a change in a second derivative of the voltage with respect to time.

In a first step, the method detects the distinct point 13 or the kink point in the voltage curve 12 of the charging process. In the process, the method checks whether the detected distinct point 13 or the detected kink point shifts relative to the SOC value 11 during OCV aging. If the detected distinct point 13 or the detected kink point does not shift relative to the SOC value 11 during OCV aging, a charging current is integrated, proceeding from the distinct point 13, in this case at 52% SOC 11. This takes place up to a subsequent exactly determinable distinct point or exactly determinable SOC value 11. This point or value can be formed, for example, by waiting for an hour and by way of an open circuit voltage adjustment at the end of the charging process.

Using the rule of three, the overall capacity of the Li-ion cell or of the HV battery is extrapolated by way of $\Delta$Ah 14 and $\Delta$SOC 15 between the two reliably and exactly determined SOC values 11.

German patent application no. 10 2020 122 111.8, filed Aug. 25, 2020, to which this application claims priority, is hereby incorporated herein by reference in its entirety.

Aspects and features of the various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled.

The invention claimed is:

1. A method for determining a capacity of at least one lithium-ion cell, during open circuit voltage aging with the aid of at least one distinct point in at least one voltage curve during a charging process or in at least one open circuit voltage of the lithium-ion cell, comprising:

measuring the at least one open circuit voltage of the lithium-ion cell or measuring the at least one voltage curve of the lithium-ion cell during the charging process of the lithium-ion cell;

detecting the at least one distinct point of the at least one open circuit voltage of the lithium-ion cell or of the at least one voltage curve of the lithium-ion cell during the charging process when a second derivative of the at least one open circuit voltage or of the at least one voltage curve of the lithium-ion cell changes with respect to time;

checking a shift of the at least one distinct point in at least one of the at least one open circuit voltage of the lithium-ion cell and the at least one voltage curve of the lithium-ion cell due to open circuit voltage aging;

ascertaining the at least one distinct point in the open circuit voltage of the lithium-ion cell or in the voltage curve of the lithium-ion cell when a non-shift of the distinct point has been checked; and using the at least one distinct point as a state of charge reference point.

2. The method according to claim 1, wherein the capacity of the at least one lithium-ion cell, during open circuit voltage aging is ascertained with the aid of the at least one distinct point while charging the lithium-ion cell with a constant voltage.

3. The method according to claim 1, wherein the at least one distinct point is generated, without a customary waiting period, while charging the at least one lithium-ion cell with a constant current and with a constant voltage to a cell voltage that can be reliably assigned to a state of charge.

4. The method according to claim 1, wherein the at least one distinct point is ascertained in an open circuit voltage characteristic curve.

5. The method according to claim 1, wherein the at least one distinct point is formed at a state of charge between 10% and 90%.

6. The method according to claim 1, wherein the at least one distinct point is formed at a state of charge between 30% and 70%.

7. The method according to claim 1, wherein the at least one distinct point is ascertained during an AC charging process.

8. The method according to claim 1, wherein the at least one distinct point is ascertained by way of a gradient of the voltage.

9. The method according to claim 8, wherein the distinct point is reached during a change of the gradient.

10. The method according to claim 9, wherein a charging current is integrated, or is integrated, up to a subsequent determinable distinct point, proceeding from the change of the gradient.

11. The method according to claim 1, wherein the lithium-ion cell already exhibits polarization effects, or for reducing a waiting period, continues to be charged with a constant current via a constant voltage.

12. The method according to claim 1, wherein the at least one lithium-ion cell is a battery.

* * * * *